(12) United States Patent
Herrin et al.

(10) Patent No.: US 7,420,426 B2
(45) Date of Patent: Sep. 2, 2008

(54) FREQUENCY MODULATED OUTPUT CLOCK FROM A DIGITAL PHASE LOCKED LOOP

(75) Inventors: Scott W. Herrin, Round Rock, TX (US); Chris C. Dao, Pflugerville, TX (US); Patrick M. Falvey, Austin, TX (US); Thomas J. Rodriguez, Austin, TX (US); Jules D. Campbell, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 443 days.

(21) Appl. No.: 11/323,294

(22) Filed: Dec. 30, 2005

(65) Prior Publication Data

US 2007/0153952 A1   Jul. 5, 2007

(51) Int. Cl.
*H03L 7/085* (2006.01)
(52) U.S. Cl. .................. 331/1 A; 331/17; 327/156; 327/159; 375/376
(58) Field of Classification Search .............. 331/16, 331/17, 18, 19, 1 A; 327/156, 157, 159; 375/373–376; 455/260
See application file for complete search history.

(56) References Cited

U.S. PATENT DOCUMENTS

| 5,425,074 | A | 6/1995 | Wong |
| 6,348,823 | B1 | 2/2002 | Pan |
| 6,606,004 | B2 | 8/2003 | Staszewski et al. |
| 6,664,827 | B2 | 12/2003 | O'Leary et al. |
| 7,282,999 | B2 * | 10/2007 | Da Dalt et al. .............. 331/1 A |
| 2004/0213324 | A1 * | 10/2004 | Hall et al. .................... 375/130 |
| 2005/0122145 | A1 * | 6/2005 | Ido et al. ..................... 327/156 |
| 2007/0152766 | A1 * | 7/2007 | Herrin et al. ................ 331/1 A |

* cited by examiner

*Primary Examiner*—Robert J. Pascal
*Assistant Examiner*—Ryan J. Johnson
(74) *Attorney, Agent, or Firm*—Dillon & Yudell LLP

(57) ABSTRACT

A frequency modulated output of a digital locked loop (DLL) is implemented with a Johnson Counter outputting a sample clock and a synchronized digital code at a multiple of the sample clock. The digital code drives a digital-to-analog converter to generate a frequency modulated control signal. The control signal is summed with the center frequency control from the digital locked loop digital filter to provide a frequency modulated center frequency control signal to the DLL oscillator.

15 Claims, 4 Drawing Sheets

FREQUENCY MODULATED OUTPUT CLOCK FROM A DIGITAL PHASE LOCKED LOOP

BACKGROUND OF THE INVENTION

1. Field of the Invention

The present invention relates generally to a digital phase locked loop, and in particular to a digital phase locked loop that generates a frequency modulated output clock.

2. Description of the Related Art

Phase locked loops (PLL) have been widely used in communication systems or the like, some frequently appearing in applications such as extracting information from carrier waves or synchronous signals. A phase locked loop is a well-known clock synchronization technique to drive a timing signal, synchronized or locked, to a reference clock signal.

A PLL is a frequency-selective circuit generally containing a phase comparator, a low-pass filter, and an oscillator coupled in a feedback arrangement. When an input or reference clock signal is applied to the PLL, the phase comparator compares the phase of the reference clock signal with the phase of the oscillator output signal and generates an error signal that is related to the phase relationship between the two signals. This error signal is filtered, amplified, and applied to the oscillator, thus driving the frequency of the oscillator output signal in a direction to more closely align its phase to that of the reference clock signal. When the oscillator output frequency is sufficiently close to the reference frequency, the feedback nature of the PLL causes the oscillator output to lock to the reference clock signal frequency, with the exception of some finite phase difference. This point is called the "zero phase error." While the phases may not be aligned, their frequencies are matched such that the amount of phase difference remains substantially constant. The self-correcting nature of the PLL thus allows the system to track the frequency changes of the reference clock signal once it is locked. A frequency divider is often inserted in the feedback loop when the desired output frequency of the oscillator is some multiple of the reference clock signal frequency.

In combination with a digital phase detector, fully-digital PLLs include a digital loop filter instead of the traditional analog filter, and include a digitally-controlled oscillator instead of the voltage-controlled oscillator. In theory, these fully digital PLLs have several advantages over their analog counterparts. First, digital logic exhibits much better noise immunity than analog circuitry. Second, analog components are vulnerable to DC offset and drift phenomena that are not present in equivalent digital implementations. Further, the loop dynamics of analog PLLs are quite sensitive to process technology scaling, whereas the behavior of digital logic remains unchanged with scaling. Moreover, power dissipation is of extreme concern for portable, battery-powered, computing or communication systems. Digital PLLs reduce the power supply voltage requirements of integrated circuits.

As is known in the art, high frequency clock generation circuits such as those used in portable, electronic devices produce significant levels of electromagnetic interference (EMI). This can be particularly detrimental in portable, wireless communication applications. Consequently, manufacturers of wireless communication devices, such as cell phones, employ various techniques to reduce the EMI produced by such high frequency components. One technique employed to reduce EMI generated by a PLL clock generation circuit is to inject frequency modulation at the output of the PLL to effectively spread the frequency spectrum output and thereby affect a reduction in EMI.

FIG. 1 is a block diagram of a typical PLL 100 of the prior art using frequency modulation on its output to reduce the circuit's generation of EMI. The PLL 100 includes a phase detector 110 having a first input for the referenced clock signal and a second input for the feedback signal. The output of the phase detector 110 is coupled to the input of a digital filter 120. The output of the digital filter 120 is coupled to the input of a first adder 130, where a second input of the adder 130 receives a frequency modulation signal ($f_m$). The frequency modulation signal ($f_m$) is generated through a separate oscillation system. The output of multiplier 130 is coupled to the input to a digitally controlled oscillator 140, which generates an oscillated clock signal on its output. The output of digitally controlled oscillator 140 is also coupled to an input of divider 150. The output of digitally-controlled oscillator 140 is fed back to the second input of the phase detector 110 through a frequency divider 150 to operate as the feedback signal to phase detector 110.

As will be appreciated, the inherent variations in clock generation systems will cause the injected frequency modulation signal to change the average center frequency output by digitally controlled oscillator 140. Without precise synchronization of the reference clock signal and the frequency modulation signal, there may be significant fluctuations in the average clock frequency output of the digital PLL. Moreover, the added circuitry required to generate the frequency modulation signal further complicates the overall digital circuitry of the integrated circuit.

For the reasons stated above, and for other reasons which will become apparent to those skilled in the art upon reading and understanding the present specification, there is a need in the art for an alternative digital locked loop system capable of establishing a digital frequency or phase locked loop output clock having frequency modulation without altering the average system frequency output and with minimal added complexity.

BRIEF DESCRIPTION OF THE DRAWINGS

This invention is described in a preferred embodiment in the following description with reference to the drawings, in which like numbers represent the same or similar elements, as follows.

In the following detailed description of exemplary embodiments of the invention, reference is made to the accompanying drawings, which form a part hereof, and in which is shown by way of illustration specific exemplary embodiments in which the invention may be practiced.

DETAILED DESCRIPTION OF PREFERRED EMBODIMENTS

In the following detailed description of exemplary embodiments of the invention, specific exemplary embodiments in which the invention may be practiced are described in sufficient detail to enable those skilled in the art to practice the invention, but it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims. In particular, although the preferred embodiment is described below with respect to a wireless mobile communication device, it will be appreciated that the present invention is not so limited and that it has application to other embodiments of electronic devices such as portable digital assistants, digital cameras, portable storage devices, audio players and portable gaming devices, for example.

Figure 1:
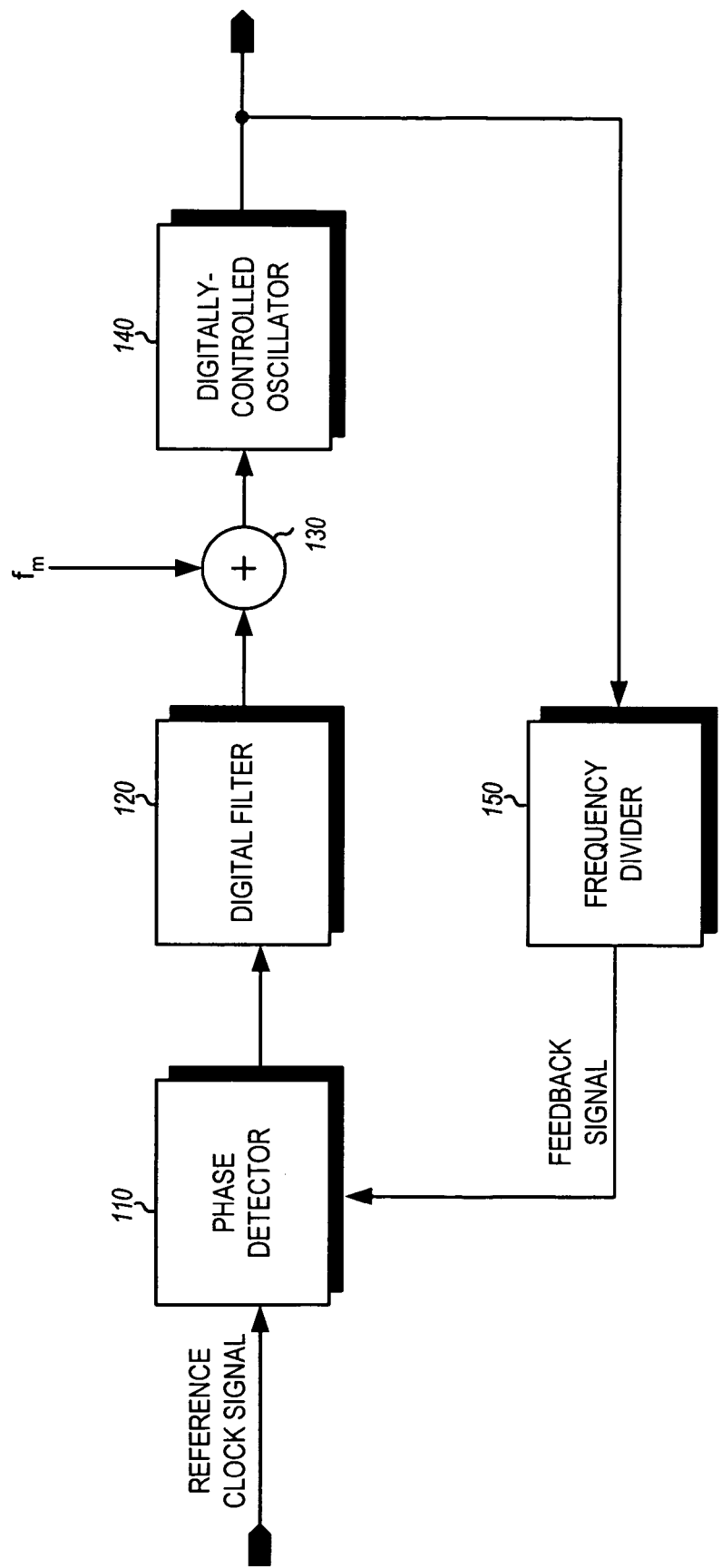
FIG. 1 is a block diagram of a typical PLL of the prior art using frequency modulation on its output to reduce the circuit's generation of EMI.
Figure 2:
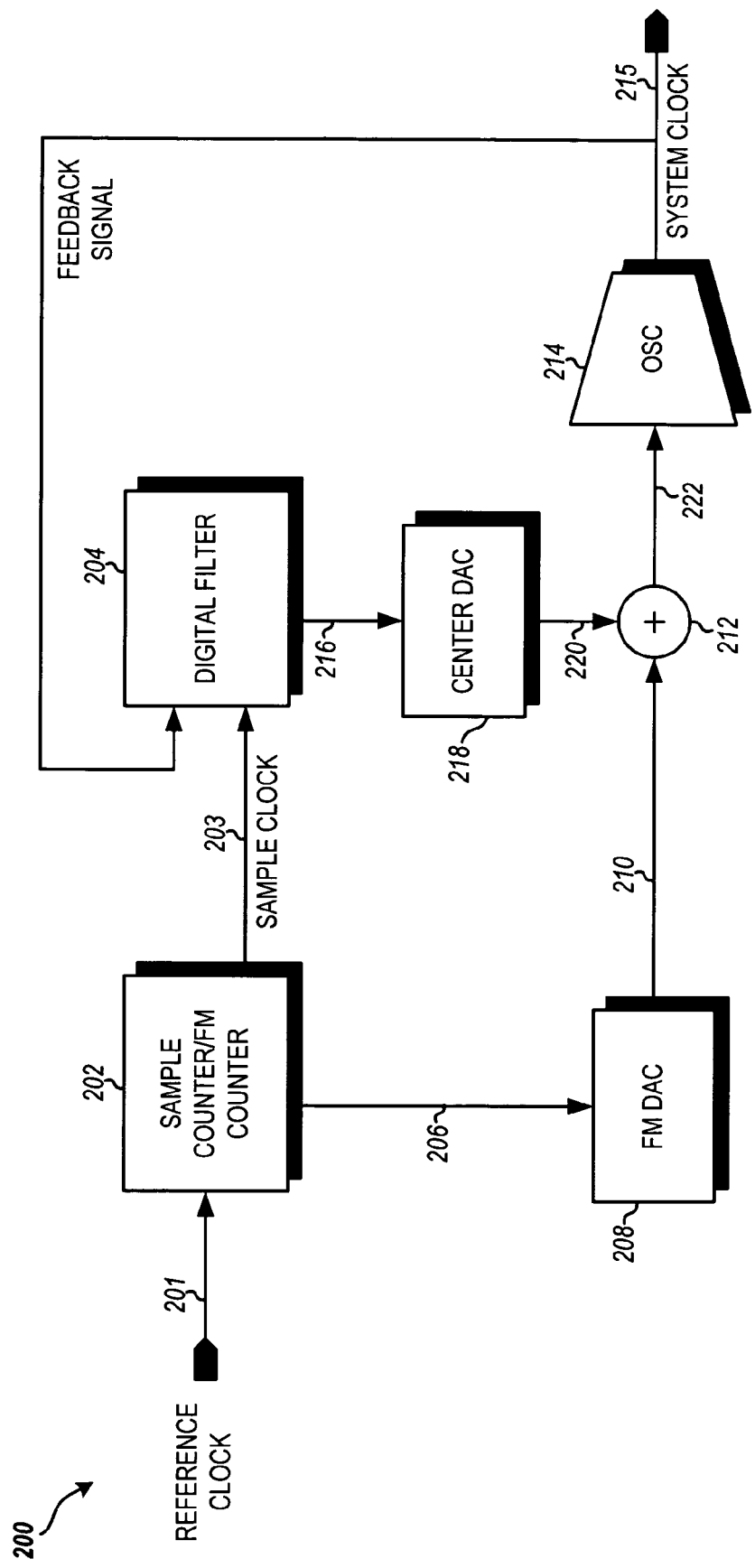
FIG. 2 shows a frequency-modulated digital locked loop, in accordance with a preferred embodiment of the present invention.

With reference now to FIG. 2, there is shown a frequency-modulated digital locked loop, in accordance with a preferred embodiment of the present invention. A digital locked loop (DLL) is any digital locked loop circuit such as a phase or frequency locked loop circuit. DLL 200 shown in FIG. 2 can be a phase or frequency locked loop circuits in alternative embodiments. DLL 200 includes a sample counter/frequency modulation counter 202 receiving a reference clock 201 at an input. Counter 202 outputs a sample clock 203 to provide the sampling frequency of the DLL 200. Counter 202 transmits sample clock 203 to a first input of digital filter 204, and outputs a digital control signal 206 on a bus coupled to an input of a Frequency Modulation (FM) digital-to-analog converter (DAC) 208. A second input of digital filter 204 receives the feedback of the system clock output 215 from oscillator 214.

In a preferred embodiment, sample counter/FM counter 202 takes the form of the well-known Johnson Counter, where each bit of the counter drives an equally-weighted leg of the FM DAC 208. Circuit designers have turned to conventional Johnson counters to perform high frequency synthesis as well as high speed clock generation. The conventional Johnson counter operates as a high-speed divider since its clocking rate is only limited by logic within each flip-flop plus one additional inverter delay. The conventional Johnson counter is divisible in proportion to its number of flip-flops; namely, a conventional n-bit Johnson counter (i.e., a Johnson counter having "n" flip-flops cascaded together) is able to divide an input signal by "2n".

FM DAC 208 converts the digital control signal 206 to an analog FM signal 210. FM signal 210 is generated between −4 MHz and 4 MHz over a period of modulation of 200 KHz. FM signal 210 on the output of FM DAC 208 is coupled to a first input of adder 212. In a preferred embodiment, FM DAC 208 is a 14-bit Binary Weighted DAC. It will be appreciated by those skilled in the art that FM DAC 208 can be a 4-bit, 8-bit or other resolution DAC in other embodiments, and that the present invention is not limited to the preferred embodiment of a 14-bit DAC. Further, it will be appreciated by those skilled in the art that FM DAC 208 can be of a pulse-width modulation, segmented, oversampling such as a sigma-delta or other type DAC in other embodiments, and that the present invention is not limited to the preferred embodiment of a Binary Weighted DAC.

Digital filter 204 generates a digital code identifying the error-corrected center frequency 216 in response to the phase difference between the received sample clock 203 from counter 202 and the feedback of the system clock 215 from oscillator 214. Internally, digital filter 204 generates an error signal indicative of a phase relationship between the sample clock signal and the feedback signal, and filters the error signal to produce the control signal 216. Center DAC 218 is coupled to the output of digital filter 204 to receive control signal 216 and converts it to an analog center frequency signal 220 specifying a phase-error-adjusted center frequency of the system clock output 215. Analog center frequency signal 220 can be 40 MHz, for example. Center frequency signal 220 is received at a second input of adder 212 to be combined with the FM signal 210 to generate a FM center frequency signal 222. In one example, the center frequency of 40 MHz is frequency modulated from between 36 MHz and 44 MHz at a rate of 200 KHz on the output 215 to affect the benefits of EMI reduction. Because center frequency 220 and FM signal 210 are derived from the same counter 202 and therefore inherently synchronized, a synchronized addition is performed by adder 212 to generate a frequency modulated center frequency signal that has no fluctuation in the average center frequency as a result of the introduction of the frequency modulation. Frequency modulated center frequency 222 is coupled to an input of oscillator 214, which generates the system clock 215 at its output.

Figure 3:
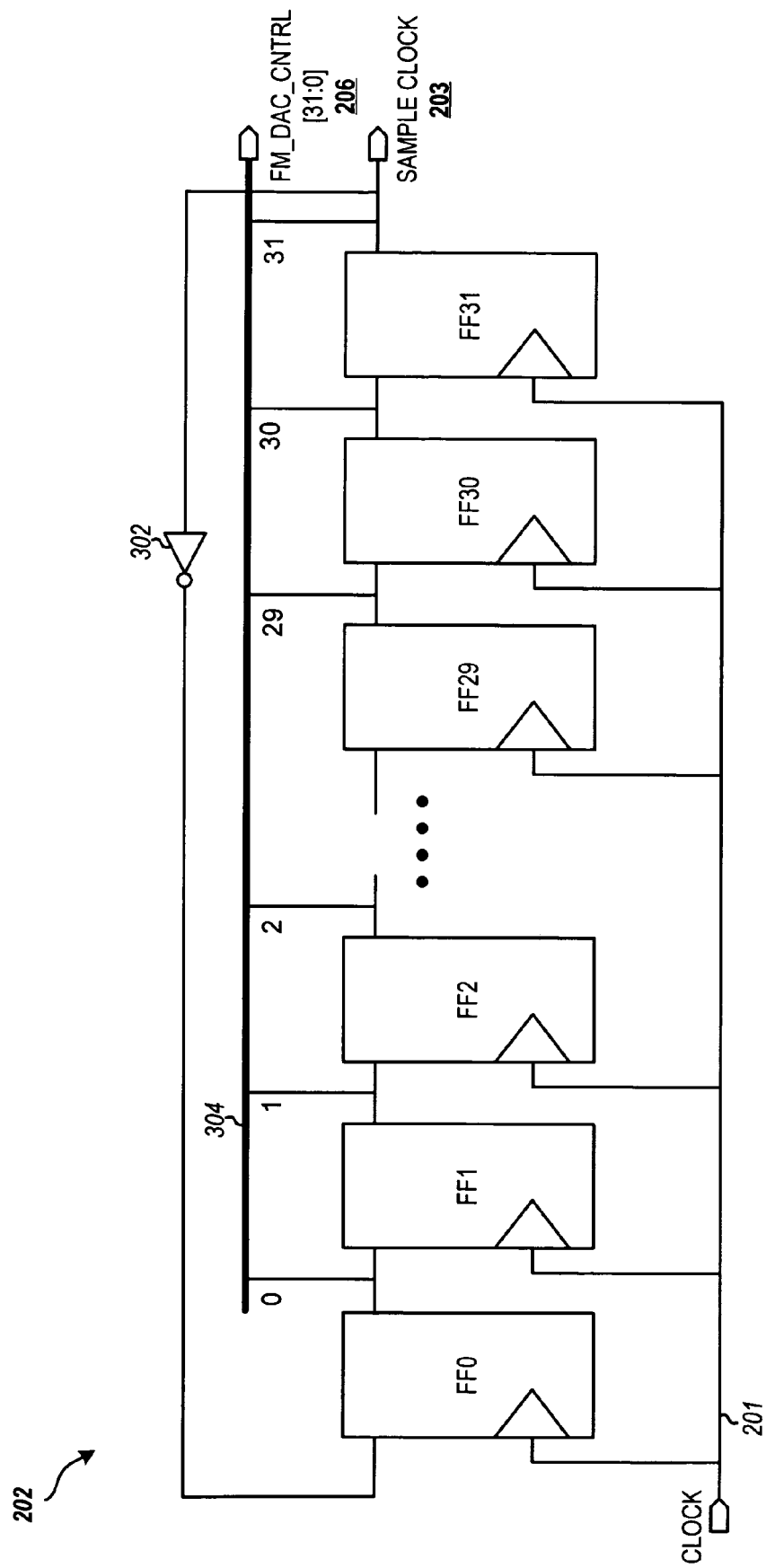
FIG. 3 shows a block diagram of a Johnson Counter generating the FM control word for driving the FM DAC, in accordance with a preferred embodiment of the present invention.

FIG. 3 shows a block diagram of a Johnson Counter generating the FM control word for driving the FM DAC, in accordance with a preferred embodiment of the present invention. Sample counter/FM counter 202 receives a common reference clock 201 at each of its 32 flip-flops (FF0-FF31) for synchronous purposes. Each of flip-flops FF0-FF30, generally D-type flip-flops, is cascaded together via their output signal lines coupled to the toggle input of the next flip-flop. The stored data output of FF31 is output as sample clock 203 and is also input to inverter 302 to be inverted on the toggle input of FF0. As is well known by those skilled in the art, a 32-flip-flop Johnson Counter will output a signal or pulse on sample clock 203 every sixteen cycles of reference clock 201. In accordance with a preferred embodiment of the present invention, each stored data output of flip-flops FF0-FF31 is also coupled to a corresponding control bit line on FM DAC control bus 304. Each bit of FM DAC control bus 304 drives an equally weighted leg of the FM DAC 208 at input 206.

Figure 4:
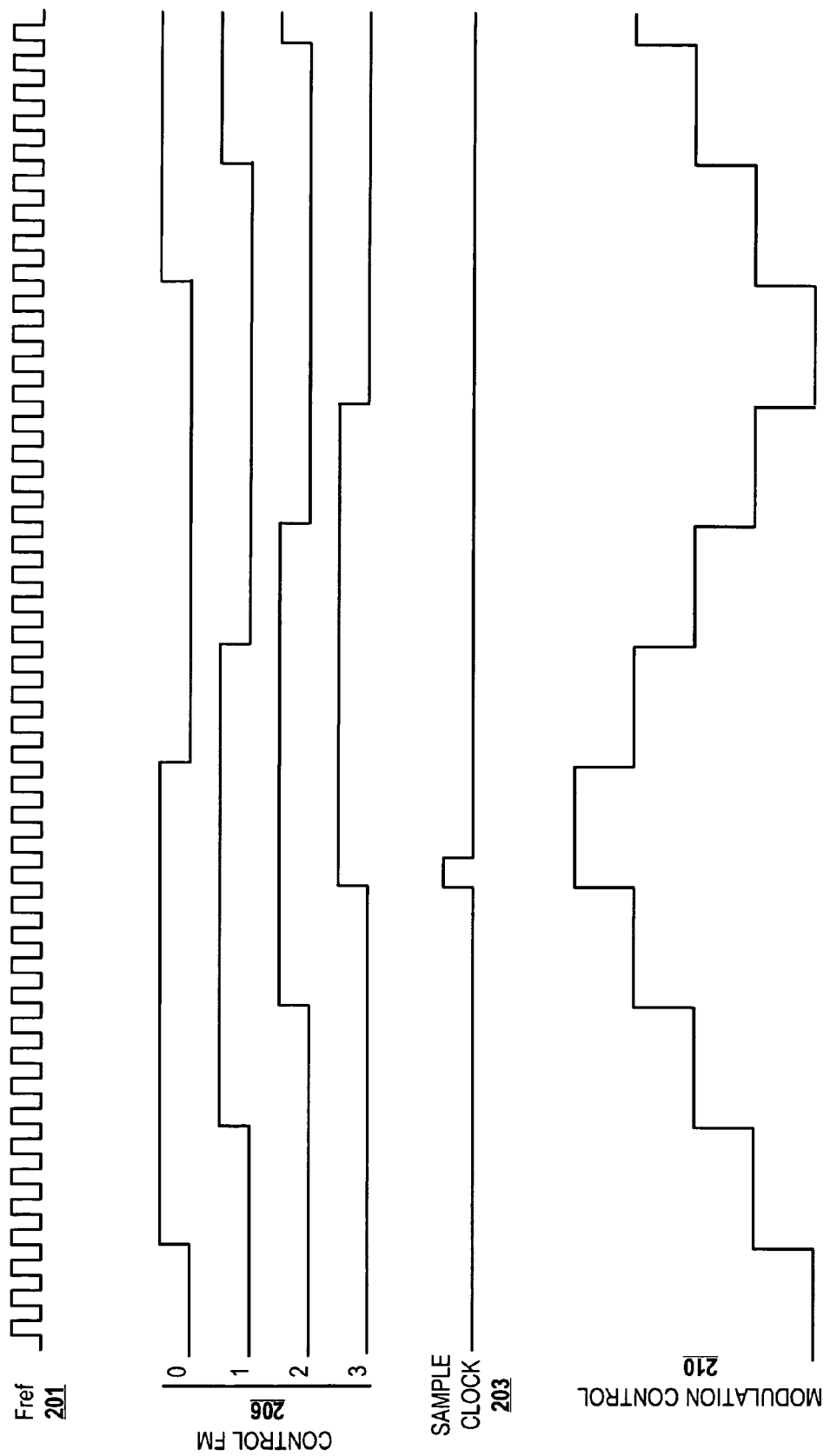
FIG. 4 shows a timing diagram of a frequency-modulated digital locked loop, in accordance with a preferred embodiment of the present invention.

With reference now to FIG. 4, there is shown a timing diagram for a FM DLL, in accordance with a preferred embodiment of the present invention. To simplify the description, FIG. 4 shows a timing diagram for a 4-bit sample counter/FM counter 202, instead of the 32-bit counter described in the embodiment of FIG. 3. FM DLL 200 receives the reference clock (Fref) 201 at the clock inputs of 4 flip-flops contained within the sample counter/FM counter 202. FM DAC control word 206 is output on 4-bit bus 301 coupled to the input of FM DAC 208. A pulse is generated on sample clock 203 by sample counter/FM counter 202 when the last flip-flop in the Johnson Counter (in this example flip-flop 4) is clocked with a toggle bit set by the previous flip-flop. The modulation control signal 210 is shown as being ramped with each bit increase of signal 206 at the input of FM DAC 208. As will be appreciated, this generates the frequency modulation at the input of adder 212. Importantly, modulation control signal 210 is synchronized with the center frequency signal 220 generated by Center DAC 218, which is triggered off of sample clock 203. In this way, there is no impact on the center frequency of the oscillation control signal 222.

As will be appreciated, the processes in preferred embodiments of the present invention may be implemented using any combination of computer programming software, firmware or hardware. As a preparatory step to practicing the invention in software, the computer programming code (whether software or firmware) according to a preferred embodiment will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the computer programming code is used by either executing the code directly from the storage device, by copying the code from the storage device into another storage device such as a hard disk, RAM, etc., or by transmitting the code for remote execution. The method form of the invention may be practiced by combining one or more machine-readable storage devices containing the code according to the present invention with appropriate standard computer hardware to execute the code contained therein. An apparatus for practicing the invention could be one or more computers and storage systems containing or having network access to computer program(s) coded in accordance with the invention.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. An apparatus comprising:
   a counter having an input for receiving a reference clock signal, a first output providing a frequency modulation signal and an output for providing a sample clock signal, wherein the frequency modulation signal is synchronized to a frequency multiple of the sample clock signal;
   a digital device having a first input for receiving the sample clock signal, a second input for receiving a feedback signal, and an output for providing a digital error signal indicating a difference between the sample clock signal and the feedback signal;
   a summing device having a first input for receiving the frequency modulation signal and a second input for receiving the error signal, and an output for providing a frequency modulated center frequency signal resulting from a combination of the frequency modulation signal and the error signal; and
   an oscillator having an input for receiving the frequency modulated control signal and an output for providing a timing signal, wherein the feedback signal is derived from the timing signal.

2. The apparatus of claim 1, wherein the digital device is a digital loop filter.

3. The apparatus of claim 1, wherein the counter is a Johnson Counter.

4. The apparatus of claim 1, wherein the counter generates a plurality of digital bit output signals on one or more digital bit output signal lines, the counter including a plurality of flip-flops cascaded together, each output of the plurality of flip-flops coupled to the one or more digital bit output signal lines to provide frequency synthesis of the reference clock signal to the frequency modulation signal having a desired frequency relative to the reference clock signal.

5. The apparatus of claim 4, wherein each of the one or more digital bit output signal lines is received at an equally weighted input of a digital-to-analog converter.

6. The apparatus of claim 1, further comprising a digital-to-analog converter receiving the output of the digital device to generate an analog form of the error signal at its output.

7. The apparatus of claim 1, wherein the apparatus is a digital phase locked loop.

8. The apparatus of claim 1, wherein the apparatus is a digital frequency locked loop.

9. A method for generating an oscillation signal of a digital locked loop, the method comprising the steps of:
   synthesizing a reference clock signal to generate a divided sample clock signal at a first output of a counter;
   synthesizing a reference clock signal to generate a divided frequency modulation signal at a second output of a counter, wherein the frequency modulated signal is synchronized with the sample clock signal;
   generating an error signal indicative of a phase relationship between a reference clock signal and a feedback signal;
   filtering the error signal to produce a control signal;
   combining the control signal with the frequency modulated signal to generate an oscillation signal;
   deriving the feedback signal from the oscillation signal.

10. The method of claim 9, wherein the step of combining includes frequency modulating the control signal with the frequency modulated signal.

11. The method of claim 9, further comprising the steps of:
    generating a plurality of sample signals;
    generating intermediate count signals from a counter between generating the plurality of sample signals; and
    generating the frequency modulated signal from the intermediate count signals.

12. The method of claim 9, wherein the step of filtering is performed by a digital filter.

13. The method of claim 9, wherein the step of synthesizing is performed by a Johnson Counter.

14. The method of claim 9, wherein the digital locked loop is a digital phase locked loop.

15. The method of claim 9, wherein the digital locked loop is a digital frequency locked loop.

* * * * *